US009898643B2

(12) United States Patent
Chang et al.

(10) Patent No.: US 9,898,643 B2
(45) Date of Patent: Feb. 20, 2018

(54) FINGERPRINT IDENTIFICATION DEVICE AND MANUFACTURING METHOD THEREOF

(71) Applicants: INTERFACE OPTOELECTRONIC (SHENZHEN) CO., LTD., Shenzhen (CN); GENERAL INTERFACE SOLUTION LIMITED, Miaoli County (TW)

(72) Inventors: Chun-Te Chang, Hsinchu (TW); Yu-Pi Kuo, Hsinchu (TW); Chung-Wu Liu, Hsinchu (TW); Chia-Chun Tai, Hsinchu (TW); Wei-Chung Chuang, Hsinchu (TW); Yen-Heng Huang, Hsinchu (TW)

(73) Assignees: INTERFACE OPTOELECTRONIC (SHENZHEN) CO., LTD., Shenzhen (CN); GENERAL INTERFACE SOLUTION LIMITED, Zhubei (TW)

( * ) Notice: Subject to any disclaimer, the term of this patent is extended or adjusted under 35 U.S.C. 154(b) by 90 days.

(21) Appl. No.: 14/960,917

(22) Filed: Dec. 7, 2015

(65) Prior Publication Data
US 2016/0224821 A1 Aug. 4, 2016

(30) Foreign Application Priority Data

Jan. 30, 2015 (CN) .......................... 2015 1 0048627

(51) Int. Cl.
*G06K 9/00* (2006.01)

(52) U.S. Cl.
CPC .. *G06K 9/0004* (2013.01); *H01L 2224/16225* (2013.01)

(58) Field of Classification Search
CPC .................... G06K 9/0004; H01L 2224/16225
See application file for complete search history.

(56) References Cited

U.S. PATENT DOCUMENTS 5,499,938 A * 3/1996 Nakamoto .............. H01J 9/025
445/50
6,437,391 B1 * 8/2002 Oh .................... H01L 21/76895
257/306

(Continued)

FOREIGN PATENT DOCUMENTS

WO 2014/128260 A1 8/2014

*Primary Examiner* — Mekonen Bekele
(74) *Attorney, Agent, or Firm* — ScienBiziP, P.C.

(57) ABSTRACT

The present disclosure provides a fingerprint identification device including a substrate, a contact layer, a processing unit, and a plurality of sensor electrodes. The substrate includes a first sub-substrate, a second sub-substrate, and an adhesive layer. The adhesive layer is between the first sub-substrate and the second sub-substrate. A plurality of first sub-holes is defined in the first sub-substrate. A plurality of second sub-holes is defined in the second sub-substrate. A plurality of third sub-holes is defined in the adhesive layer. One of the first sub-holes communicates a corresponding one of the third sub-holes and a corresponding one of the second sub-holes to define a corresponding hole. An end of each of the sensor electrodes is coupled to the processing unit. The other end of each of the sensor electrodes passes through one of the holes, extends to the contact layer, and is covered by the contact layer.

9 Claims, 12 Drawing Sheets

(56) References Cited

U.S. PATENT DOCUMENTS

| | | | |
|---|---|---|---|
| 2008/0054875 A1* | 3/2008 | Saito | A61B 5/1172 324/71.5 |
| 2008/0176046 A1* | 7/2008 | Yamaguchi | B81C 3/008 428/195.1 |
| 2010/0068453 A1* | 3/2010 | Imai | C03C 15/00 428/131 |
| 2011/0193123 A1* | 8/2011 | Moon | H01L 33/382 257/98 |
| 2012/0168792 A1* | 7/2012 | Kang | H01L 33/486 257/94 |
| 2013/0194071 A1 | 8/2013 | Slogedal et al. | |
| 2013/0260205 A1* | 10/2013 | Kwon | H01M 10/04 429/127 |
| 2014/0042638 A1* | 2/2014 | Liu | H01L 23/49822 257/774 |
| 2014/0097989 A1 | 4/2014 | Cheng et al. | |
| 2014/0147625 A1* | 5/2014 | Lin | C09J 7/026 428/140 |
| 2015/0245473 A1* | 8/2015 | Shimizu | H05K 1/0298 257/778 |
| 2016/0064611 A1* | 3/2016 | Choi | H01L 33/382 257/98 |
| 2016/0322294 A1* | 11/2016 | Kobayashi | H01L 23/49822 |

* cited by examiner

United States Patent (US 9,898,643 B2)

FINGERPRINT IDENTIFICATION DEVICE AND MANUFACTURING METHOD THEREOF

CROSS-REFERENCE TO RELATED APPLICATIONS

This application claims priority to Chinese Patent Application No. 201510048627.9 filed on Jan. 30, 2015, the contents of which are incorporated by reference herein.

FIELD

The subject matter herein generally relates to a fingerprint identification device and a method for manufacturing the fingerprint identification device.

BACKGROUND

Fingerprint identification devices are widely used in industry, national defense, and electron fields. A typical fingerprint identification device includes a substrate, a contact layer at one side of the substrate, a processing unit at the other side of the substrate, and a plurality of sensor electrodes passing through the substrate via a plurality of through holes to couple with the processing unit.

BRIEF DESCRIPTION OF THE DRAWINGS

Implementations of the present technology will now be described, by way of example only, with reference to the attached figures.

DETAILED DESCRIPTION

Figure 1:
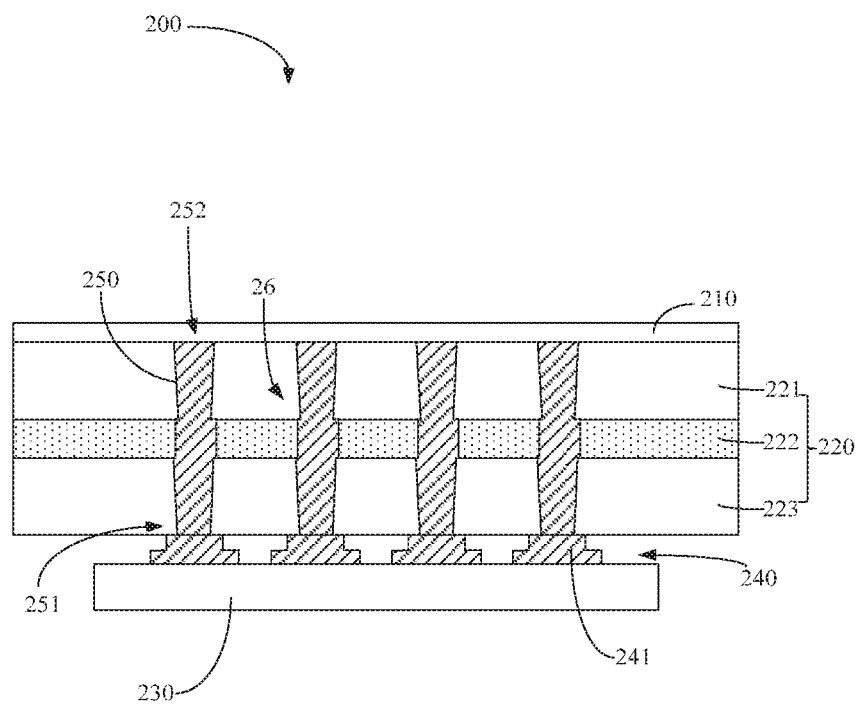
FIG. 1 is a cross-sectional view of a fingerprint identification device according to a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising", when utilized, means "including, but not necessarily limited to"; it specifically indicates open-ended inclusion or membership in the so-described combination, group, series and the like.

FIG. 1 is a cross-sectional view of a fingerprint identification device 200 according to a first embodiment. Referring to FIG. 1, the fingerprint identification device 200 includes a contact layer 210, a substrate 220, a processing unit 230, a connector 240, and a plurality of sensor electrodes 250.

The contact layer 210 is located at one side of the substrate 220. The processing unit 230 is located at the other side of the substrate 220. The connector 240 is sandwiched between the substrate 220 and the processing unit 230. The substrate 220 defines a plurality of holes 26 passing through the substrate 220. An end of each of the sensor electrodes 250 is coupled to the connector 240. The other end of each of the sensor electrodes 250 passes through one of the holes 26, extends to the contact layer 210, and is covered by the contact layer 210.

The contact layer 210 protects the sensor electrodes 250. The contact layer 210 can be made of diamond-like carbon (DLC) or amorphous diamond.

The processing unit 230 detects voltages or currents passing through the sensor electrodes 250 to identify fingerprints on the contact layer 210. The connector 240 transfers signals from the sensor electrodes 250 to the processing unit 230. The connector 240 includes a plurality of connection pads 241. The connector 240 further couples the processing unit 230 to an external circuit (not shown) and transfers the signals from the processing unit 230 to the external circuit.

Each of the sensor electrodes 250 includes a first end 251 adjacent to the connector 240 and a second end 252 away from the connector 240. The first end 251 is coupled to a corresponding connection pad 241. The second end 252 passes through one of the holes 26, extends to the contact layer 210, and is covered by the contact layer 210. The sensor electrodes 250 can be made of transparent conductive materials, such as indium tin oxide (ITO), or non-transparent conductive materials, such as metal materials.

Figure 2:
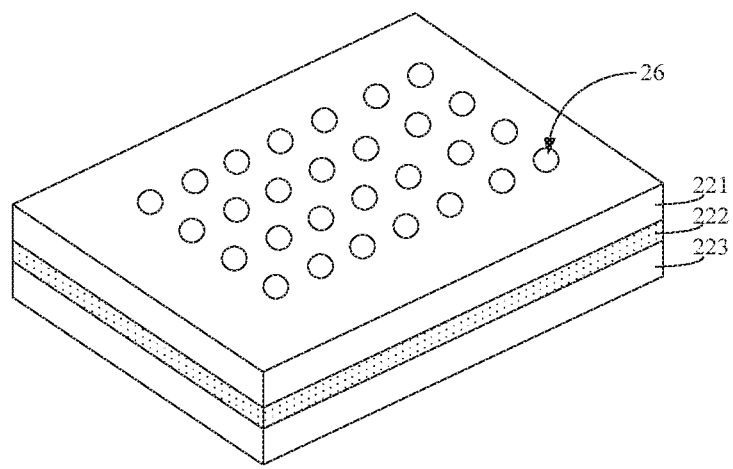
FIG. 2 is a isometric view of the fingerprint identification device of FIG. 1.

Referring to FIG. 2, the substrate 220 includes a first sub-substrate 221, a second sub-substrate 223, and a first adhesive layer 222 between the first sub-substrate 221 and the second sub-substrate 223. The first sub-substrate 221 is adhered to the second sub-substrate 223 by the first adhesive layer 222. The first sub-substrate 221 is located between the first adhesive layer 222 and the contact layer 210. The second sub-substrate 223 is located between the first adhesive layer 222 and the connector 240.

The holes 26 respectively pass through the first sub-substrate 221, the first adhesive layer 222, and the second sub-substrate 223 in that order. A distance between two geometrical centers of two adjacent holes 26 is in a range from about 50 um to 200 um.

Figure 3:
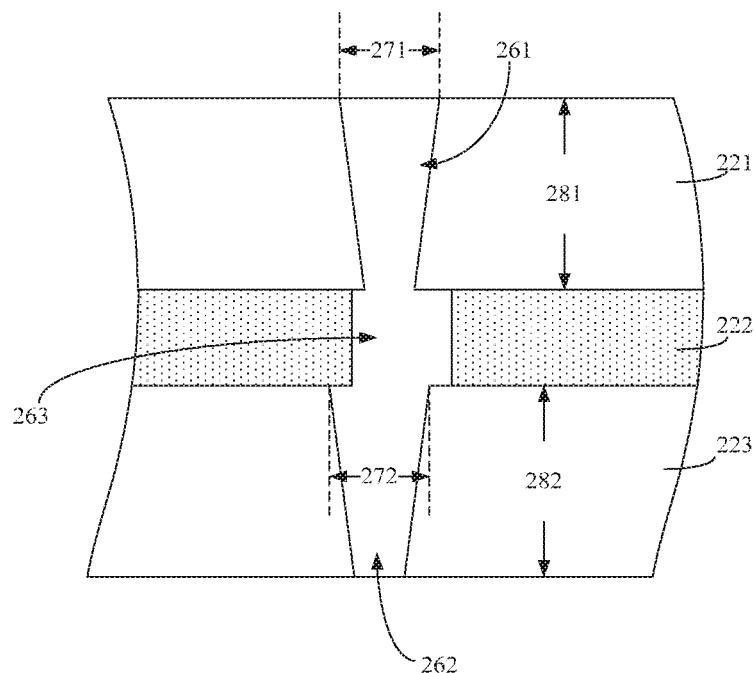
FIG. 3 is an isometric view of a fingerprint identification device having a first sub-hole, a second sub-hole, and a third sub-hole define a hole.

Referring to FIG. 3, in this embodiment, a plurality of first sub-holes 261 are defined in the first sub-substrate 221, a plurality of second sub-holes 262 are defined in the second sub-substrate 223, and a plurality of third sub-holes 263 are defined in the first adhesive layer 222. One of the first sub-holes 261 communicates a corresponding one of the third sub-holes 263 and a corresponding one of the second sub-holes 262 to define a corresponding hole 26.

The first sub-holes 261 and the second sub-holes 262 are inverted cone-shaped. An aperture of each of the first sub-hole 261 gradually reduces along a direction from the first sub-substrate 221 to the first adhesive layer 222. An aperture of each of the second sub-hole 262 gradually reduces along a direction from the first adhesive layer 222 to the second sub-substrate 223.

Each of the third sub-holes 263 can be cylindrical shaped. A maximum width 271 of the aperture of each of the first sub-holes 261 is not less than one eighth of a thickness 281 of the first sub-substrate 221. A maximum width 272 of the aperture of each of the second sub-hole 262 is not less than one eighth of a thickness 282 of the second sub-substrate 223.

Figure 4:
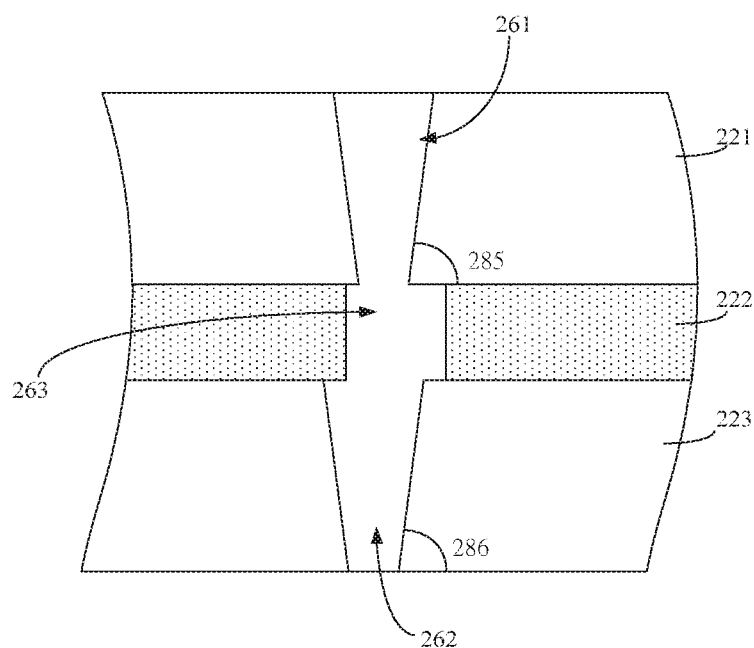
FIG. 4 is an isometric view of a fingerprint identification device having a first angle and a second angle.

Referring to FIG. 4, in this embodiment, a first angle 285 is formed between the first sub-hole 261 and a surface of the first sub-substrate 221 adjacent to the first adhesive layer 222. The first angle 285 is in a range from 70 degrees to 90 degrees. A second angle 286 is formed between the second sub-hole 262 and a surface of the second sub-substrate 223 away from the first adhesive layer 222. The second angle 286 is in a range from 70 degrees to 90 degrees. Preferably, a shape of the first sub-hole 261 is the same with a shape of the second sub-hole 262.

Figure 5:
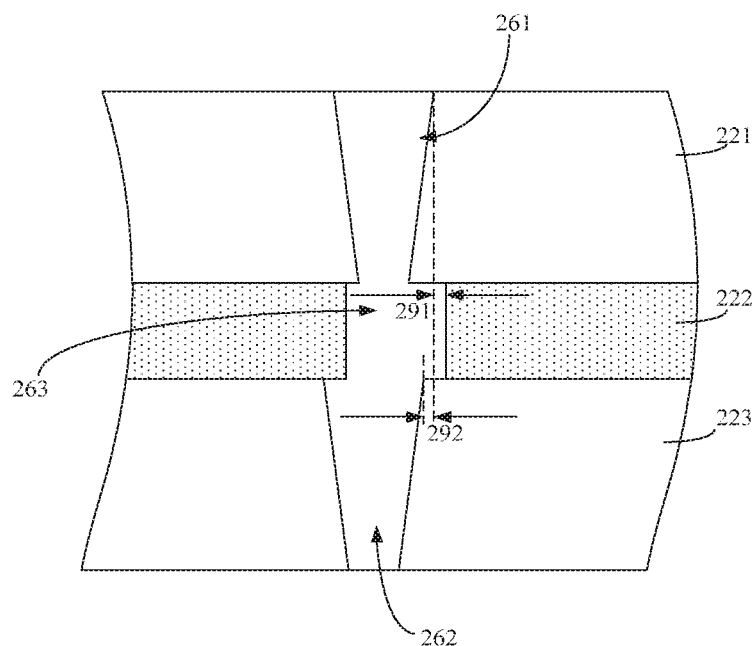
FIG. 5 is an isometric view of a fingerprint identification device having two distances.

Referring to FIG. 5, in this embodiment, a distance 291 between a projection of an edge of the first sub-hole 261 having a maximum width on the first adhesive layer 222 and an edge of the third sub-hole 263 adjacent to the projection is not exceeding 30 um. A distance 292 between a projection of an edge of the first sub-hole 261 having a maximum width on the second sub-substrate 223 and an edge of the second sub-hole 262 adjacent to the projection is not exceeding 30 um.

In this embodiment, the first sub-substrate 221 and the second sub-substrate 223 are made of glass, Polymethyl Methacrylate (PMMA), Polycarbonate (PC), Polyimide (PI), or Sapphire. The first adhesive layer 222 is made of Optically Clear Adhesive (OCA), Optical Clear Resin (OCR), or Polyvinyl Butyral (PVB).

Figure 6:
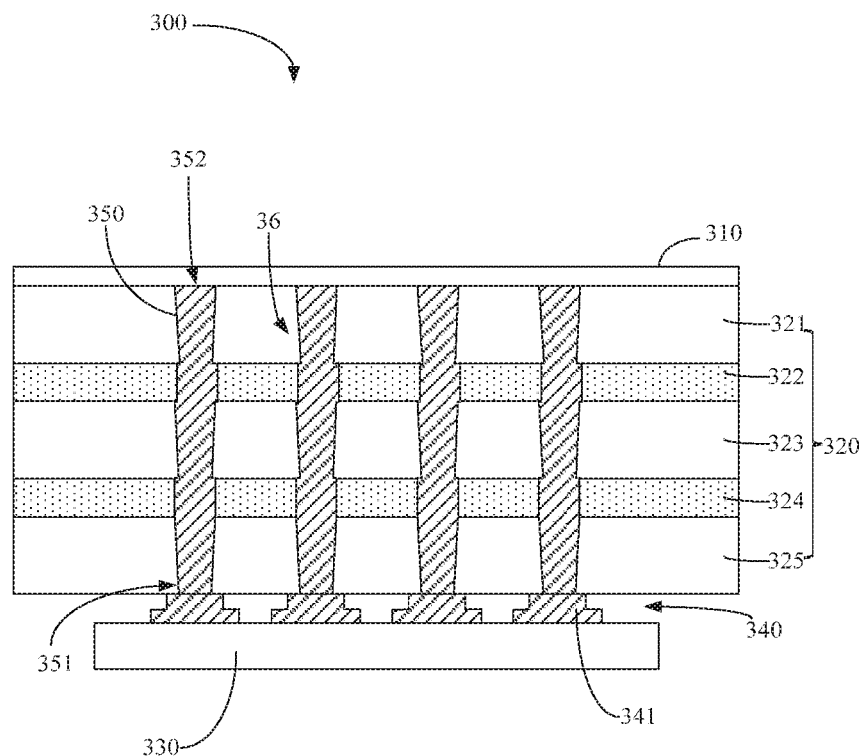
FIG. 6 is a cross-sectional view of a fingerprint identification device according to a second embodiment.

FIG. 6 is a cross-sectional view of a fingerprint identification device 300 of a second embodiment. Referring to FIG. 6, the fingerprint identification device 300 includes a contact layer 310, a substrate 320, a processing unit 330, a connector 340, and a plurality of sensor electrodes 350. In this embodiment, the substrate 320 includes three sub-substrates, and thus the substrate 320 is thicker than the substrate 220 in the first embodiment.

The contact layer 310 is located at one side of the substrate 320. The processing unit 330 is located on the other side of the substrate 320. The connector 340 is sandwiched between the substrate 320 and the processing unit 330. The substrate 320 defines a plurality of holes 36 passing through the substrate 320. An end of each of the sensor electrodes 350 is coupled to the connector 340. The other end of each of the sensor electrodes 350 passes through one of the holes 36, extends to the contact layer 310, and is covered by the contact layer 310.

The contact layer 310 protects the sensor electrodes 350. The contact layer 310 can be made of diamond-like carbon (DLC) or amorphous diamond.

The processing unit 330 detects voltages or currents passing through the sensor electrodes 350 to identify fingerprints on the contact layer 310. The connector 340 transfers signals from the sensor electrodes 350 to the processing unit 330. The connector 340 includes a plurality of connection pads 341. The connector 340 further couples the processing unit 330 to an external circuit (not shown) and transfers the signals from the processing unit 330 to the external circuit.

Each of the sensor electrodes 350 includes a first end 351 adjacent to the connector 340 and a second end 352 away from the connector 340. The first end 351 is coupled to a corresponding connection pad 341. The second end 352 passes through one of the holes 36, extends to the contact layer 310, and is covered by the contact layer 310. The sensor electrodes 350 can be made of transparent conductive materials, such as indium tin oxide (ITO), or non-transparent conductive materials, such as metal materials.

Figure 7:
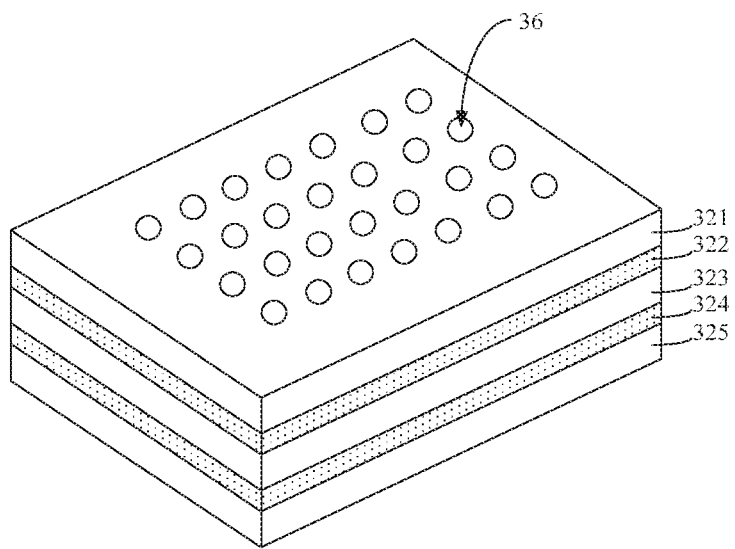
FIG. 7 is a top view of the fingerprint identification device of FIG. 6.

Referring to FIG. 7, the substrate 320 includes a first sub-substrate 321, a second sub-substrate 323, a third sub-substrate 325, a first adhesive layer 322 between the first sub-substrate 321 and the second sub-substrate 323, and a second adhesive layer 324 between the second sub-substrate 323 and the third sub-substrate 325. The first sub-substrate 321 is adhered to the second sub-substrate 323 by the first adhesive layer 322. The second sub-substrate 323 is adhered to the third sub-substrate 325 by the second adhesive layer 324. The first sub-substrate 321 is located between the first adhesive layer 322 and the contact layer 310. The third sub-substrate 325 is located between the second adhesive layer 324 and the connector 340.

The holes 36 respectively pass through the first sub-substrate 321, the first adhesive layer 322, the second sub-substrate 323, the second adhesive layer 324, and the third sub-substrate 325 in that order. A distance between two geometrical centers of two adjacent holes 36 is in a range from about 50 um to 200 um.

Figure 8:
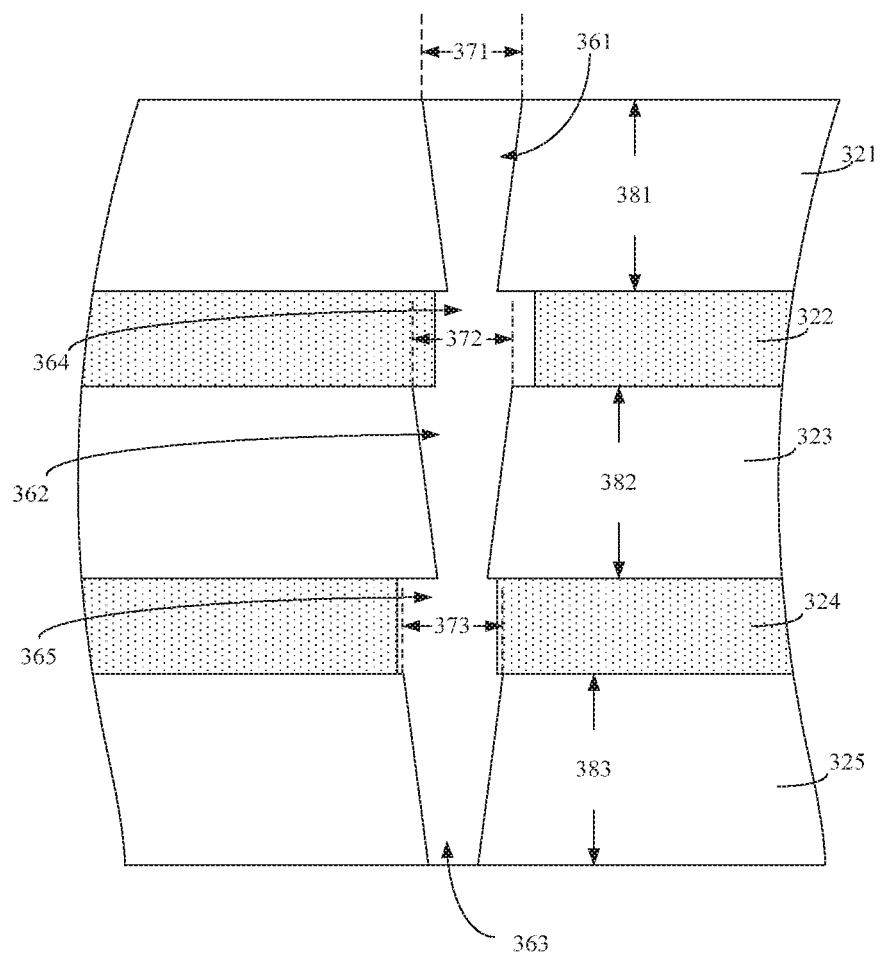
FIG. 8 is an isometric view of a fingerprint identification device having a first sub-hole, a second sub-hole, a third sub-hole, a fourth sub-hole, and a fifth sub-hole define a hole.

Referring to FIG. 8, in this embodiment, a plurality of first sub-holes 361 are defined in the first sub-substrate 321, a plurality of second sub-holes 362 are defined in the second sub-substrate 323, a plurality of third sub-holes 363 are defined in the third sub-substrate 325, a plurality of fourth sub-holes 364 are defined in the first adhesive layer 322, and a plurality of fifth sub-holes 365 are defined in the second adhesive layer 324. One of the first sub-holes 361 communicates a corresponding one of the fourth sub-holes 364, a corresponding one of the second sub-holes 362, a corresponding one of the fifth sub-hole 365, and a corresponding one of the third sub-hole 363 to define a corresponding hole 36.

The first sub-holes 361, the second sub-holes 362, and the third sub-holes 363 are inverted cone-shaped. An aperture of each of the first sub-holes 361 gradually reduces along a direction from the first sub-substrate 321 to the first adhesive layer 322. An aperture of each of the second sub-holes 362 gradually reduces along a direction from the first adhesive layer 322 to the second adhesive layer 324. An aperture of each of the third sub-holes 363 gradually reduces along a direction from the second adhesive layer 324 to the third sub-substrate 325.

Each of the fourth sub-holes 364 and the fifth sub-holes 365 can be cylindrical shaped. A maximum width 371 of the aperture of the first sub-hole 361 is not less than one eighth of a thickness 381 of the first sub-substrate 321. A maximum width 372 of the aperture of the second sub-hole 362 is not less than one eighth of a thickness 382 of the second sub-substrate 323. A maximum width 373 of the aperture of the third sub-hole 363 is not less than one eighth of a thickness 383 of the third sub-substrate 325.

Figure 9:
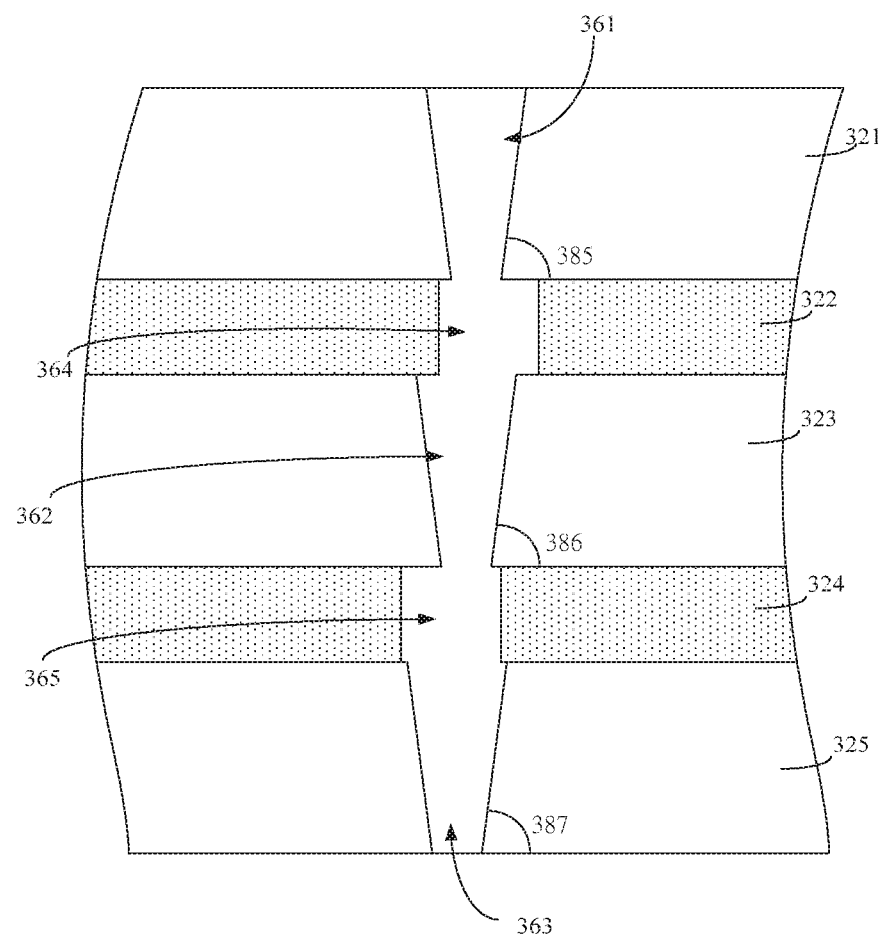
FIG. 9 is an isometric view of a fingerprint identification device having a first angle, a second angle, and a third angle.

Referring to FIG. 9, in this embodiment, a first angle 385 is formed between the first sub-hole 361 and a surface of the first sub-substrate 321 adjacent to the first adhesive layer 322. The first angle 385 is in a range of from 70 degrees to 90 degrees. A second angle 386 is formed between the second sub-hole 362 and a surface of the second sub-substrate 323 adjacent to the second adhesive layer 324. The second angle 386 is in a range of from 70 degrees to 90 degrees. A third angle 387 is formed between the third sub-hole 363 and a surface of the third sub-substrate 325 away from the second adhesive layer 324. The third angle 387 is in a range of from 70 degrees to 90 degrees. Preferably, a shape of the first sub-hole 361 is the same with a shape of the second sub-hole 362 and a shape of the third sub-hole 363.

Figure 10:
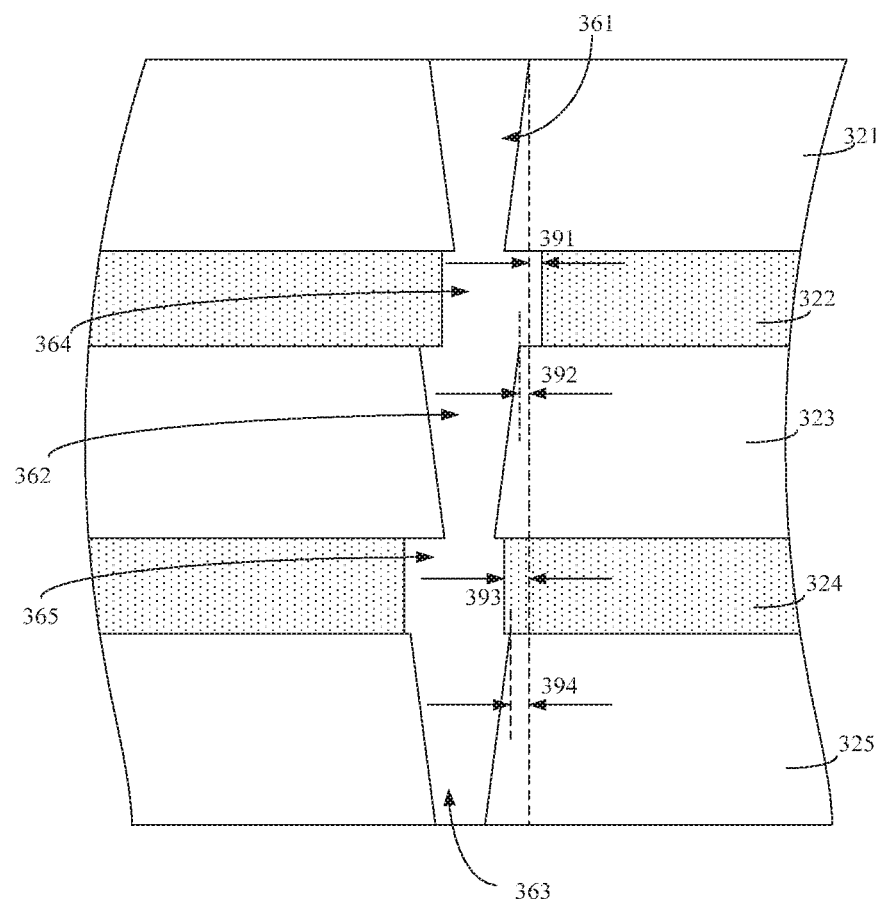
FIG. 10 is an isometric view of a fingerprint identification device having four distances.

Referring to FIG. 10, in this embodiment, a distance 391 between a projection of an edge of the first sub-hole 361 having a maximum width on the first adhesive layer 322 and an edge of the fourth sub-hole 364 adjacent to the projection is not exceeding 30 um. A distance 392 between a projection of an edge of the first sub-hole 361 having a maximum width on the second sub-substrate 323 and an edge of the second sub-hole 362 adjacent to the projection is not exceeding 30 um. A distance 393 between a projection of an edge of the first sub-hole 361 having a maximum width on the second adhesive layer 324 and an edge of the fifth sub-hole 365 adjacent to the projection is not exceeding 30 um. A distance 394 between a projection of an edge of the first sub-hole 361 having a maximum width on the third sub-substrate 325 and an edge of the third sub-hole 363 adjacent to the projection is not exceeding 30 um.

In this embodiment, the first sub-substrate 321, the second sub-substrate 323, and the third sub-substrate 325 are made of glass, PMMA, PC, PI, or Sapphire. The first adhesive layer 322 and the second adhesive layer 324 are made of OCA, OCR, or PVB.

Figure 11:
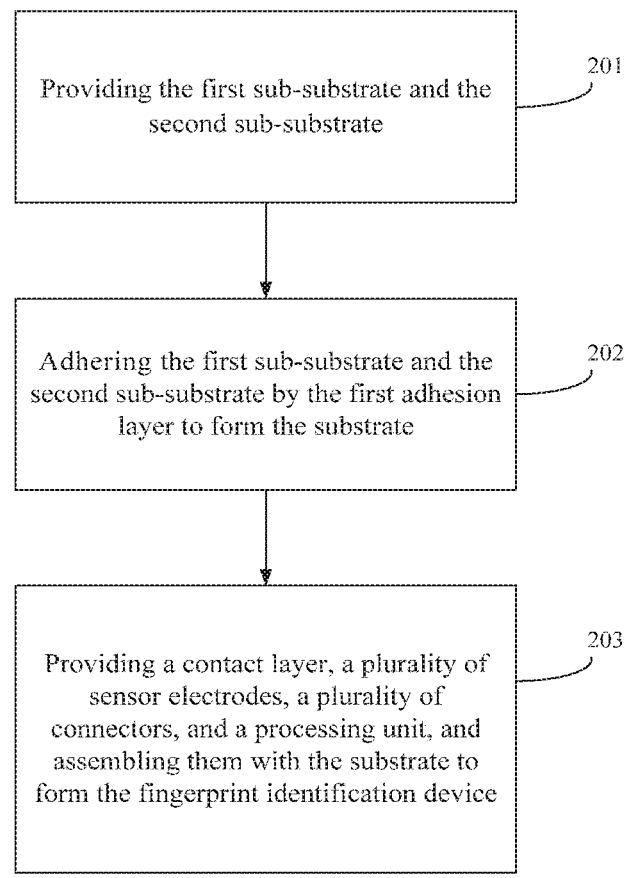
FIG. 11 is a flowchart for manufacturing the fingerprint identification device of FIG. 1.

Referring to FIG. 11, a flowchart for manufacturing the fingerprint identification device 200 is presented in accordance with an example embodiment which is being thus illustrated. The example method is provided by way of example, as there are a variety of ways to carry out the method. Each block shown in FIG. 11 represents one or more processes, methods or subroutines, carried out in the exemplary method. Furthermore, the illustrated order of blocks is by example only and the order of the blocks can change according to the present disclosure. Additional blocks may be added or fewer blocks may be utilized, without departing from this disclosure. The exemplary method can begin at block 201.

At block 201, the first sub-substrate 221 and the second sub-substrate 223 are provided; a plurality of first sub-holes 261 are defined in the first sub-substrate 221, and a plurality of second sub-holes 262 are defined in the second sub-substrate 223. The second sub-holes 262 are corresponding to the first sub-holes 261.

In this embodiment, the first sub-holes 261 and the second sub-holes 262 are defined by a laser drilling process. The first sub-substrate 221 and the second sub-substrate 223 are made of glass, PMMA, PC, PI, or Sapphire.

At block 202, the first sub-substrate 221 and the second sub-substrate 223 are adhered by the first adhesive layer 222 to form the substrate 220. The first sub-holes 261 and the second sub-holes 262 are communicated to define the holes 26.

In detail, the first adhesive layer 222 is formed on the second sub-substrate 223, and then the first sub-substrate 221 is formed on the first adhesive layer 222 so that the first sub-substrate 221 and the second sub-substrate 223 are adhered by the first adhesive layer 222. After the first sub-substrate 221 and the second sub-substrate 223 are adhered, a plurality of third sub-holes 263 are defined in the first adhesive layer 222 corresponding to the first sub-holes 261 and the second sub-holes 262 so that the first sub-holes 261, the second sub-holes 262, and the third sub-holes 263 define the holes 26. Then, the first adhesive layer 222 is cured by Ultraviolet Light (UV-light).

In this embodiment, the first adhesive layer 222 is made of OCA, OCR, or PVB.

At block 203, a contact layer 210, a plurality of sensor electrodes 250, a plurality of connectors 240, and a processing unit 230 are provided and assembled with the substrate 220 to form the fingerprint identification device 200. The contact layer 210 is formed at one side of the substrate 220. The processing unit 230 is formed on the other side of the substrate 220. The connectors 240 are formed between the substrate 220 and the processing unit 230. The sensor electrodes 250 are formed in the holes 26. An end of each of the sensor electrodes 250 is coupled to the connectors 240. The other end of each of the sensor electrodes 250 passes through one of the holes 26, extends to the contact layer 210, and is covered by the contact layer 210.

In this embodiment, the contact layer 210 is made of diamond-like carbon (DLC) or amorphous diamond. In this embodiment, the sensor electrodes 250 are made of ITO (Indium Tin Oxide) or metal.

Figure 12:
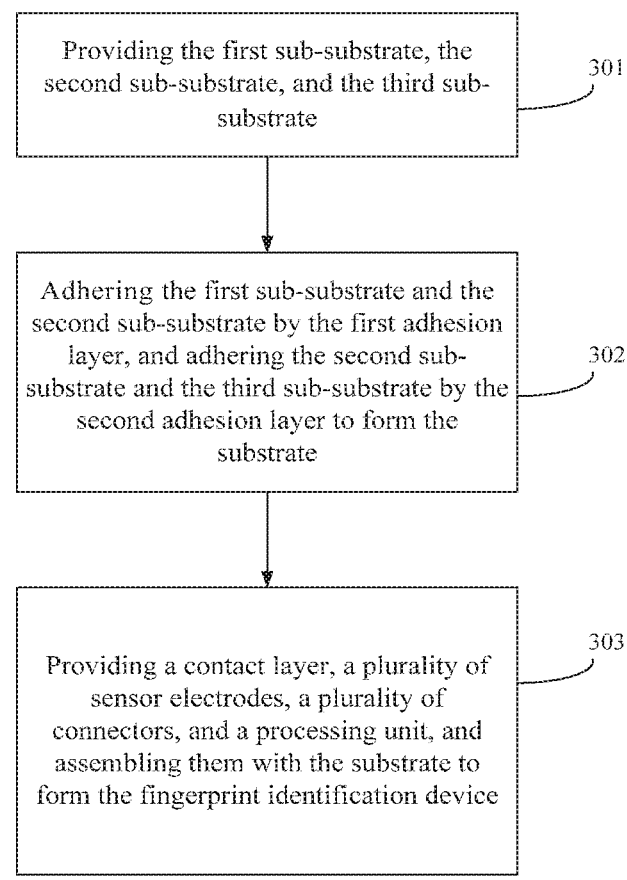
FIG. 12 is a flowchart for manufacturing the fingerprint identification device of FIG. 6.

Referring to FIG. 12, a flowchart for manufacturing the fingerprint identification device 300 is presented in accordance with an example embodiment which is being thus illustrated. The example method is provided by way of example, as there are a variety of ways to carry out the method. Each block shown in FIG. 12 represents one or more processes, methods or subroutines, carried out in the exemplary method. Furthermore, the illustrated order of blocks is by example only and the order of the blocks can change according to the present disclosure. Additional blocks may be added or fewer blocks may be utilized, without departing from this disclosure. The exemplary method can begin at block 301.

At block 301, the first sub-substrate 321, the second sub-substrate 323, and the third sub-substrate 325 are provided; a plurality of first sub-holes 361 are defined in the first sub-substrate 321, a plurality of second sub-holes 362 are defined in the second sub-substrate 323, and a plurality of third sub-holes 363 are defined in the third sub-substrate 325. The first sub-holes 361, the second sub-holes 362, and the third sub-holes 363 are corresponding to each other.

In this embodiment, the first sub-holes 361, the second sub-holes 362, and the third sub-holes 363 are defined by a laser drilling process. The first sub-substrate 321, the second sub-substrate 323, and the third sub-substrate 325 are made of glass, PMMA, PC, PI, or Sapphire.

At block 302, the first sub-substrate 321 and the second sub-substrate 323 are adhered by the first adhesive layer 322; the second sub-substrate 323 and the third sub-substrate 325 are adhered by the second adhesive layer 324, so that the first sub-substrate 321, the first adhesive layer 322, the second sub-substrate 323, the second adhesive layer 324, and the third sub-substrate 325 form the substrate 320. The first sub-holes 361, the second sub-holes 362, and the third sub-holes 363 are communicated to define the holes 36.

In detail, the second adhesive layer 324 is formed on the third sub-substrate 325, and then the second sub-substrate 323 is formed on the second adhesive layer 324. After that, the first adhesive layer 322 is formed on the second sub-substrate 323, and then the first sub-substrate 321 is formed on the first adhesive layer 322 so that the first sub-substrate 321, the second sub-substrate 323, and the third sub-substrate 325 are adhered by the first adhesive layer 322 and the second adhesive layer 324. After the first sub-substrate 321, the second sub-substrate 323, and the third sub-substrate 325 are adhered, a fourth sub-hole 364 is defined in the first adhesive layer 322 corresponding to the first sub-hole 361 and the second sub-hole 362, and a fifth sub-hole 365 is defined in the second adhesive layer 324 corresponding to the second sub-hole 362 and the third sub-hole 363 so that the first sub-hole 361, the second sub-hole 362, and the third sub-hole 363, the fourth sub-hole 364, and the fifth sub-hole 365 define the hole 36. Then, the first adhesive layer 322 and the second adhesive layer 324 are cured by UV-light.

In this embodiment, the first adhesive layer 322 and the second adhesive layer 324 are made of OCA, OCR, or PVB. At block 303, a contact layer 310, a plurality of sensor electrodes 350, a plurality of processing unit interfaces 340, and a processing unit 330 are provided and assembled with the substrate 320 to form the fingerprint identification device 300. The contact layer 310 is formed at one side of the substrate 320. The processing unit 330 is formed on the other side of the substrate 320. The processing unit interfaces 340 are formed between the substrate 320 and the processing unit 330. The sensor electrodes 350 are formed in the holes 36. An end of each of the sensor electrodes 350 is coupled to the processing unit interfaces 340. The other end of each of the sensor electrodes 350 passes through one of the holes 36, extends to the contact layer 310, and is covered by the contact layer 310.

In this embodiment, the contact layer 310 is made of diamond-like carbon (DLC) or amorphous diamond. In this embodiment, the sensor electrodes 350 are made of ITO (Indium Tin Oxide) or metal.

The embodiments shown and described above are only examples. Many details are often found in the art such as the other features of a fingerprint identification device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A fingerprint identification device comprising:
    a substrate comprising a first sub-substrate, a second sub-substrate, and an adhesive layer between the first sub-substrate and the second sub-substrate configured to adhere the first sub-substrate to the second sub-substrate;
    the first sub-substrate defining a plurality of first sub-holes;
    the second sub-substrate defining a plurality of second sub-holes;
    the adhesive layer defining a plurality of third sub-holes, wherein one of the plurality of first sub-holes communicates a corresponding one of the plurality of third sub-holes and a corresponding one of the plurality of second sub-holes to define a corresponding hole;
    a contact layer formed at one side of the substrate;
    a processing unit at another side of the substrate opposite the one side; and
    a plurality of sensor electrodes, wherein an end of each of the plurality of sensor electrodes is coupled to the processing unit and another end of each of the plurality of sensor electrodes passes through one of the holes, extends to the contact layer, and is covered by the contact layer;
    wherein the first sub-substrate is located between the contact layer and the adhesive layer, the second sub-substrate is located between the adhesive layer and the processing unit; wherein the first sub-holes and the second sub-holes are inverted cone-shaped, an aperture of each of the first sub-hole gradually reduces along a direction from the first sub-substrate to the first adhesive layer, an aperture of each of the second sub-hole gradually reduces along a direction from the first adhesive layer to the second sub-substrate; and wherein a distance between a projection of an edge of the first sub-hole having a maximum width on the first adhesive layer and an edge of the third sub-hole adjacent to the projection is not exceeding 30 um, a distance between a projection of an edge of the first sub-hole having a maximum width on the second sub-substrate and an edge of the second sub-hole adjacent to the projection is not exceeding 30 μm.

2. The fingerprint identification device of claim 1, wherein the fingerprint identification device further comprises a connector coupled to the processing unit, the connector is located between the substrate and the processing unit and is coupled to the sensor electrodes.

3. The fingerprint identification device of claim 2, wherein the connector comprises a plurality of connection pads, the connection pads are coupled to the sensor electrodes.

4. The fingerprint identification device of claim 1, wherein a maximum width of the aperture of each of the first sub-holes is not less than one eighth of a thickness of the first sub-substrate, a maximum width of the aperture of each of the second sub-hole is not less than one eighth of a thickness of the second sub-substrate.

5. The fingerprint identification device of claim 1, wherein a first angle is formed between the first sub-hole and a surface of the first sub-substrate adjacent to the first adhesive layer, the first angle is in a range from 70 degrees to 90 degrees, a second angle is formed between the second sub-hole and a surface of the second sub-substrate away from the first adhesive layer, the second angle is in a range from 70 degrees to 90 degrees.

6. The fingerprint identification device of claim 1, wherein a distance between two geometrical centers of two adjacent holes is in a range of from 50 μm to 200 μm.

7. A fingerprint identification device comprising:
    a substrate comprising a first sub-substrate, a second sub-substrate, and an adhesive layer between the first sub-substrate and the second sub-substrate configured to adhere the first sub-substrate to the second sub-substrate;

the first sub-substrate defining a plurality of first sub-holes;

the second sub-substrate defining a plurality of second sub-holes;

the adhesive layer defining a plurality of third sub-holes, wherein one of the plurality of first sub-holes communicates a corresponding one of the plurality of third sub-holes and a corresponding one of the plurality of second sub-holes to define a corresponding hole;

a contact layer formed on the substrate;

a processing unit, wherein the processing unit and the contact layer locates on opposite sides of the substrate; and a plurality of sensor electrodes, wherein each of the plurality of sensor electrodes is in one corresponding hole; wherein the contact layer is on a side of the plurality of sensor electrodes away from the first sub-substrate; wherein each of the plurality of sensor electrodes comprises a first end and a second end opposite to the first end, the first end is coupled to the processing unit, the second end contacts the contact layer and is covered by the contact layer.

8. The fingerprint identification device of claim 7, wherein the first sub-substrate is located between the contact layer and the adhesive layer, the second sub-substrate is located between the adhesive layer and the processing unit.

9. The fingerprint identification device of claim 8, wherein the first sub-holes and the second sub-holes are inverted cone-shaped, an aperture of each of the first sub-hole gradually reduces along a direction from the first sub-substrate to the first adhesive layer, an aperture of each of the second sub-hole gradually reduces along a direction from the first adhesive layer to the second sub-substrate.

* * * * *